United States Patent [19]
Kuroda et al.

[11] Patent Number: 4,818,621
[45] Date of Patent: Apr. 4, 1989

[54] PRESSURE SENSITIVE ADHESIVES WITH REDUCIBLE ADHESIVE FORCE USING RADIATION, AND FILMS THEREWITH

[75] Inventors: Hideo Kuroda, Hannancho; Masao Taniguchi, Sennan, both of Japan

[73] Assignee: Bando Chemical Industries, Ltd., Hyogo, Japan

[21] Appl. No.: 829,818

[22] Filed: Feb. 14, 1986

[30] Foreign Application Priority Data

Feb. 14, 1985 [JP] Japan .................... 60-28030
Feb. 14, 1985 [JP] Japan .................... 60-28031
Sep. 4, 1985 [JP] Japan .................... 60-196540
Sep. 4, 1985 [JP] Japan .................... 60-196541
Sep. 4, 1985 [JP] Japan .................... 60-196542
Sep. 4, 1985 [JP] Japan .................... 60-196543
Sep. 4, 1985 [JP] Japan .................... 60-196544
Sep. 4, 1985 [JP] Japan .................... 60-196545

[51] Int. Cl.$^4$ .............. B32B 27/30; B32B 27/16; C08L 33/08; C08L 75/04
[52] U.S. Cl. .................... 428/424.6; 522/79; 522/80; 522/109; 522/83; 522/121; 522/126; 522/142; 522/147; 522/174
[58] Field of Search .............. 522/121, 142, 79, 80, 522/110, 83; 428/424.6; 523/511, 521; 524/533; 525/126

[56] References Cited

U.S. PATENT DOCUMENTS 3,060,023 10/1962 Burg .................... 522/142
4,312,916 1/1982 Kakumaru .................... 522/121
4,398,660 8/1983 Pampalone et al. .................... 525/344

FOREIGN PATENT DOCUMENTS 110582 6/1984 European Pat. Off. .
121833 10/1978 Japan .................... 522/116

OTHER PUBLICATIONS

Patents Abstracts of Japan, vol. 9, No. 36 (C-266) [1759], Feb. 15th, 1985 for JP 59179677, Dec. 10, 1984.

Primary Examiner—John C. Bleutge
Assistant Examiner—A. H. Koeckert
Attorney, Agent, or Firm—Wenderoth, Lind & Ponack

[57] ABSTRACT

A pressure sensitive adhesive film reducible in the adhesive force by the application thereto of ultraviolet light which comprises:

(a) a base film permeable to ultraviolet light; and
(b) a layer of a pressure sensitive adhesive formed on one side of the base film, the adhesive comprising:
  (i) at least one elastic polymer selected from the group consisting of a polymer mainly composed of an acrylic acid ester copolymer and a saturated copolyester mainly composed of dibasic carboxylic acids and dihydroxy alcohols;
  (ii) an ultraviolet light polymerizable acrylic acid ester having not less than two acryloyl or methacryloyl groups in the molecule and having a molecular weight of not more than about 1000, in amounts of about 15–200 parts by weight in relation to 100 parts by weight of the elastic polymer; and
  (iii) a photopolymerization initiator in amounts sufficent to induce the photopolymerization of the ultraviolet light polymerizable acrylic acid ester;

The film is especially suitable for use as a dicing film in dicing a semiconductor wafer to dices in which the wafer is fixed on the film with a relatively large adhesive force and thereafter the film is irradiated by ultraviolet light from the other side thereof to substantially reduce the adhesive force of the film so that the dice is loosely adhered onto the film.

5 Claims, No Drawings

PRESSURE SENSITIVE ADHESIVES WITH REDUCIBLE ADHESIVE FORCE USING RADIATION, AND FILMS THEREWITH

The present invention relates to a pressure sensitive adhesive which is substantially reducible in adhesive force by the application thereto of ultraviolet light, and a pressure sensitive adhesive film having thereon a layer of such a pressure sensitive adhesive suitable for use, for instance, in dicing a semiconductor wafer to dices.

The use of pressure sensitive adhesive films has been increasing in a variety of industries. Adhesive films capable of meeting a diversity of requirements and to possess more extended functions depending upon individual uses, have now been required.

For example, a dicing process is included in the production of integrated circuits, as is well known. In such process, a semiconductor wafer is placed and fixed on a pressure sensitive adhesive film called a dicing film, cut to small pieces or dices of a predetermined size, and then the dice is removed or picked up from the film. Therefore, it is desirable that the semiconductor wafer, for instance, a silicon wafer, is initially adhered onto the dicing film with a relatively strong adhesive force so as to be precisely diced to dices of a predetermined size, whereas after the dicing the resultant dice is loosely adhered onto the film so as to be readily removable therefrom.

For exemplification only, it is desired that the dicing film initially has an adhesive force of about 100–800 g/25 mm so that the wafer is precisely diced to dices, but after the dicing the film has a reduced adhesive force of several tens grams/25 mm or less for the readily removal of the resultant dices. However, no such a pressure sensitive adhesive which has a substantially reducible adhesive force so as to be suitably and practically usable for dicing a semiconductor wafer has been known to date.

On the other hand, a photocurable adhesive is already known which is curable by the application thereto of ultraviolet light to develop the desired adhesive force. The photocurable adhesive is usually composed of a photopolymerizable oligomer, a photopolymerizable monomer, a photopolymerization initiator and other additives, and is rapidly cured by the application thereto of ultraviolet light. It must be noted, however, that ultraviolet light is applied to the adhesive to complete the adhesion.

The present inventors have made an intensive investigation of a pressure sensitive adhesive for use in dicing a semiconductor water, and found unexpectedly that a photosensitive adhesive mainly composed of a certain elastic polymer as a base resin, a photopolymerizable acrylic acid ester and a photopolymerization initiator is substantially reducible in the adhesive force by the application thereto of ultraviolet light. After a further investigation based on the above finding, the inventors have found that a pressure sensitive adhesive film composed of a photopermeable base film having on one side thereof a layer of such a pressure sensitive adhesive as above mentioned is suitably usable in dicing a semiconductor wafer, since the film is capable of fixing thereon a semiconductor wafer with an adhesive force sufficient to make it possible for the wafer to be precisely diced, but loses its adhesive force by the irradiation of ultraviolet light on the other side of the film so that the dice may be readily removed therefrom.

It is, therefore, an object of the invention to provide a pressure sensitive adhesive whichis substantially reducible in adhesive force by the application thereto of ultraviolet light.

It is a further and important object of the invention to provide a pressure sensitive adhesive film or sheet which is substantially reducible in the adhesive force by the irradiation thereto of ultraviolet light.

It is still an object of the invention to provide a dicing film for use in a dicing process in which the wafer is initially fixed on the dicing film so that the wafer is precisely diced to small pieces or dices, and after the dicing, the film is substantially reduced in adhesive force by the application thereto of ultraviolet light so that the resultant dice is readily removed therefrom.

The pressue sensitive adhesive reducible in the adhesive force by the application thereto of ultraviolet light of the invention comprises:

(i) at least one elastic polymer selected from the group consisting of a polymer mainly composed of acrylic acid ester copolymers and a saturated copolyester mainly composed of dibasic carboxylic acids and dihydroxy alcohols:

(ii) an ultraviolet light polymerizable acrylic acid ester having not less than two acryloyl or methacryloyl groups in the molecule and having a molecular weight of not more than about 1000, in amounts of about 15–200 parts by weight in relation to 100 parts by weight of the elastic polymer; and (iii) a photopolymerization initiator in amounts sufficient to induce the photopolymerization of the ultraviolet light polymerizable acrylic acid ester.

The pressure sensitive adhesive film reducible in adhesive force by the application thereto of the ultraviolet light of the invention comprises:

(a) a base film permeable to ultraviolet light; and (b) a layer of the pressure sensitive adhesive as specified as above formed on one side of the base film.

Other and further objects and features of the invention will be more apparent from the following description.

The photosensitive pressure adhesive of the invention includes an elastic polymer as a main component, a photopolymerizable acrylic acid ester polymerizable by the application thereto of ultraviolet light and a photopolymerization initiator.

The photosensitive pressure adhesive film of the invention has a base film or a supporting film which is permeable to the ultraviolet light and a layer of a pressure sensitive adhesive formed on one side of the base film in which the pressure sensitive adhesive used is such that it is specified as above.

A variety of pressure sensitive adhesives are already known, as is described, for instance, in "Adhesive Handbook," 2nd ed., edited by Japan Adhesives Association, pp. 398–414 (1980), Nikkan Kogyo Shinbunsha. A typical pressure sensitive adhesive is composed of an elastic polymer as a main component, a tackifier and a plasticizer soluble to the elastic polymer, and when desired, additional components such as an antioxidant, a filler and a colorant. According to the invention, however, the pressure sensitive adhesive includes at least one specified polymer as the elastic polymer selected from the group consisting of a polymer mainly composed of acrylic acid ester copolymers and a saturated copolyester mainly composed of dibasic carboxylic acids and dihydroxy alcohols.

The acrylic acid ester polymer as the elastic polymer in the pressure sensitive adhesive of the invention is already well known in the art, and is normally a copolymer of acrylic acid ester components as main monomer components such as ethyl acrylate, butyl acrylate or 2-ethylhexyl acrylate to form adhesive soft segments of a low glass transition temperature in the polymer chain, and comonomer components such as vinyl acetate, acrylonitrile, styrene, methyl acrylate or methyl methacrylate to form cohesive hard segments of a high glass transition temperature in the polymer chain.

The elastic polymer may further include a third comonomer component having a functional group therein such as a carboxyl a hydroxyl, an amide, a glycidyl or a hydroxyalkyl to improve the curability and/or the adhesion of the resultant polymer. Examples of the third comonomer are acrylic acid, methacrylic acid, itaconic acid, hydroxymethyl methacrylate, hydroxypropyl methacrylate, acryl amide or glycidyl methacrylate.

The saturated copolyester preferably usable as the elastic polymer in the invention is per se also known, as described, for instance, in "Kogyo Zairyo (Industrial Materials)," Vol. 25, No. 11, pp. 101–106 (1977), and is a copolyester composed of a saturated dibasic carboxylic acid component and a saturated dihydroxy alcohol component, i.e., a glycol component. Hence, the copolyester has a low glass transition temperature. A mixture of an aromatic dibasic carboxylic acid and an aliphatic dibasic carboxylic acid is, for example, preferably used as the dibasic carboxylic acid component, while an aliphatic and/or an alicyclic glycol is prefeably used as the glycol component.

In the invention, a copolyester is preferred which is composed of a dibasic carboxylic acid component of an aromatic dibasic carboxylic acid and an aliphatic dibasic carboxylic acid in a molar ratio of the former to the latter of about 80/20 to 20/80, more preferably of about 70/30 to 50/50, and a glycol component, substantially in an equimolar ratio. In particular, terephthalic acid is preferred as the aromatic dibasic carboxylic acid, whereas sebacic acid and adipic acid are preferred as the aliphatic dibasic carboxylic acid, meanwhile ethylene glycol, 1,4-butanediol and propylene glycol are, for instance, preferred as the glycol component, for the copolyester suitable for use in the invention. However, the dibasic carboxylic acid component may be in part displaced by a tribasic carboxylic acid, and the glycol may be replaced by a trihydroxy alcohol.

Preferably the pressure sensitive adhesive according to the invention includes a tackifier therein in amounts not more than about 200 parts by weight in relation to 100 parts by weight of the elastic polymer. The tackifier usable in the adhesive of the invention is not restricted to a specified one, but any tackifier is usable which is known in the production of a conventional pressure sensitive adhesive.

As examples only, there are mentioned as such a tackifier, for instance, xylene resins, rosins, polymerized rosins, hydrogenated rosins, rosin esters, terpene resins, terpene-phenol resins, petroleum resins, coumarone resins, styrene resins, alkylphenol resins and the like. The tackifier is preferably included in the adhesive in amounts of about 10–200 parts by weight, more preferably 50–150 parts by weight, in relation to 100 parts by weight of the elastic polymer.

The use of the tackifier is especially useful when the copolyester is used as the elastic polymer in the adhesive. When the amount of the tackifier is less than about 10 parts by weight in relation to 100 parts by weight of the elastic polymer, the resultant adhesive tends to have an adhesive force which is, for example, insufficient to fix a semiconductor wafer for the precise dicing, whereas when the amount of the tackifier is more than about 200 parts by weight, the resultant adhesive is reducible in the adhesive force only to an insufficient extent so that, for example, in dicing a wafer, the resultant dice is not readily removable from the dicing film after the dicing, but also the tackifier undesirably tends to remain on the dice.

In connection with the tackiness of the adhesive, it is preferable to corporate both the acrylic acid ester copolymer and the saturated copolyester into an adhesive composition as elastic polymer components, since such an adhesive has a pronouncedly large tackiness, but has substantially no tendency of migration. This pressure sensitive adhesive film is especially suitable for industrial use in dicing.

The ultraviolet light polymerizable acrylic acid ester usable in the invention has two or more acryloyl or methacryloyl groups in the molecule and a molecular weight of not more than about 1000. Therefore, the acrylic acid ester usable in the invention includes, for instance, acrylates of polyhydroxy alcohols, such as ethylene glycol diacrylate, 1,6-hexanediol diacrylate, trimethylolpropane triacrylate, tetramethylolmethane tetraacrylate and dipentaerythritol hexaacrylate, and methacrylates of polyhydroxy alcohols, such as ethylene glycol dimethacrylate, 1,6-hexanediol dimethacrylate, trimethylolpropane trimethacrylate, tetramethylolmethane tetramethacrylate and dipentaerythritol pentamethacrylate.

The ultraviolet light photopolymerizable acrylic acid ester is included in the pressure sensitive adhesive in amounts of about 15–200 parts by weight in relation to 100 parts by weight of the elastic polymer. When the photopolymerizable acrylic acid ester is included in amounts less than about 15 parts by weight in relation to 100 parts by weight of the elastic polymer, the resultant adhesive is not substantially reducible in the adhesive force by the application of the ultraviolet light thereto. Meanwhile when the photopolymerizable acrylic acid ester is included in amounts more than about 200 parts by weight, the adhesive undesirably tends to migrate to a substance adhered to the layer of the adhesive, although the resultant adhesive is substantially reducible in the adhesive force by the application of the ultraviolet light.

The pressure sensitive adhesive of the invention further includes a photopolymerization initiator or photosensitizer, and in addition, may include, when desired, a polymerization inhibitor. The initiator is included in the adhesive to accerelate the polymerization of the photopolymerizable acrylic acid ester, as is well known in the field of the photopolymerization. Any known initiator is usable in the invention, for instance, benzoin alkylethers such as benzoin methylether and benzoin isopropylether, aromatic ketones and aromatic hydroxy ketones such as benzoin, benzil and benzophenone.

The polymerization inhibitor may be included in the adhesive of the invention, when desired, to prevent the polymerization of the photopolymerizable acrylic acid ester induced by an energy other than the ultraviolet light, for instance, thermal polymerization. The inhibitor usable in the invention is not specifically limited, and as an exemplification, picric acid, phenol, hydroquinone, hydroquinone monomethylether and the like are usable.

The amount of the initiator and the inhibitor used may be in accordance with the amount in the conventional photopolymerization technology, respecitively, and hence the initiator is incorporated in the adhesive in amounts of about 0.1–30 parts by weight, and the inhibitor in amounts of about 0.1–1 parts by weight, respectively, in relation to 100 parts by weight of the photopolymerizable acrylic acid ester, although not limited to these exemplified ranges.

The pressure sensitive adhesive of the invention may further contain therein a plasticizer such as a polybutene polymer and a mineral oil.

The pressure sensitive adhesive film of the invention is composed of a base film and a layer of the pressure sensitive adhesive in solid as set forth above formed on the base film. In the production of the pressure sensitive adhesive film of the invention, the pressure sensitive adhesive as stated above is applied prefeably in a form of a liquid composition onto one side of a base film, followed by drying the liquid composition to form a solid layer of the pressure sensitive adhesive on the base film.

The liquid compoition may be prepared, in principle, by dissolving in an organic solvent such as an aromatic hydrocarbon, an aliphatic ketone or a mixture of these, the above mentioned elastic polymer, photopolymerizable acrylic acid ester, a photopolymerization initiator, and when needed, further additives such as a tackifier, an inhibitor, a filler, an antioxidant and a colorant, each in amounts as stated hereinbefore, respectively. As the organic solvent is preferred in particular a mixture of toluene and methyl ethyl ketone, although not limited thereto. The liquid composition contains the elastic polymer preferably in amounts of about 10–50% by weight based on the liquid composition so as to be easy in coating on a base film and drying to form a solid layer of the adhesive on the base film.

The liquid composition may be prepared in any manner which is known in a conventional adhesive. The elastic polymer and the tackifier are usually available in the form of solution in organic solvents. Therefore, it is convenient to prepare the liquid composition, for example, by admixing the solutions of the elastic polymer and the tackifier together, adding to the resultant solution the photopolymerizable acrylic acid ester and the initiator, and when necessary, other additives such as an inhibitor, an antioxidant, a filler or an additional amount of an organic solvent.

As apparent, a liquid composition on the market which includes polyacrylic acid esters as the elastic polymer is also usable for preparing a pressure sensitive adhesive of the invention, since such a liquid resin composition is in many cases a mixture of the elastic polymer with other additives such as a tackifier and a plasticizer dissolved in an organic solvent, although some of the liquid acrylic acid ester polymer composition are found not to contain a tackifier and a plasticizer.

When the liquid resin composition on the market is used for the preparation of photopolymerizable pressure sensitive adhesive of the invention, the liquid composition is mixed with the photopolymerizable acrylic acid ester and the initiator, and when desired, together with other addtional components such as a polymerization inhibitor and an organic solvent, in amounts as stated hereinbefore, depending upon the amount of the elastic polymer in the liquid composition. However, it is preferred that the photopolymerizable acrylic acid ester is admixed in amounts of about 3–60 parts by weight, preferably about 5–20 parts by weight, with 100 parts by weight of the liquid composition.

The pressure sensitive adhesive film according to the invention may be prepared by forming a layer of the pressure sensitive adhesive as set forth hereinbefore on a base film permeable to the ultraviolet light, which will be now described.

Any resin film may be usable as the base film provided that the film is permeable or transparent to ultraviolet light as well as the film has a strength sufficient to form an adherend. The base film usable in the invention, therefore, includes films of polyvinyl chloride, vinyl chloride-vinylidene chloride copolymer, vinyl chloride-vinyl acetate copolymer, vinyl chloride-acrylic acid copolymer, polyvinylidene chloride, polyolefin such as polyethylene or polypropylene, polymethyl methacrylate, polyvinyl alcohol, polyamide, polyimide, polyamideimide, polyester such as polyethylene terephthalate, polycarbonate and cellulose acetate.

Among the above base films, however, films of homopolymers and copolymers of vinyl chloride and vinylidene chloride, respectively, are specifically preferred in the invention, since these films are soft and less expensive than the others. These films, in particular, a polyvinyl chloride film, however, contain therein a plasticizer, although greatly advantageous in prices over the other films.

A variety of plasticizers are known, among which are, for instance, diphthalates such as dibutyl phthalate, dioctyl phthalate, didecyl phthalate, di(tricresyl)phthalate and butyl benzyl phthalate; phosphates such as tricresyl phosphate, trioctyl phosphate, triphenyl phosphate, 2-ethylhexyl diphenyl phosphate and cresyl diphenyl phosphate; aliphatic dicarboxylic acid diesters such as dioctyl adipate, dioctyl sebacate, dioctyl azelate and tris(2-ethylhexyl) acetyl citrate; polyester plasticizers such as polypropylene adipate and polypropylene sebacate; epoxidized plasticizers such as epoxidized soybean oils; and chlorinated plasticizers such as chlorinated paraffins and chlorinated fatty acid esters.

It has been found out by the inventors that when a layer of the pressure sensitive adhesive is formed directly on a base film which contains the plasticizer therein, the plasticizer migrates into the adhesive, but also the photopolymerizable acrylic acid ester migrates into the base film since the plasticizer has usually a good miscibility with or solubility to the low molecular weight photopolymerizable acrylic acid ester used in the invention.

This bidirectional migration of the plasticizer and the photopolymerizable acrylic acid ester in the pressure sensitive adhesive film has been found to remarkably decrease the degree of the reduction in the adhesive force of the pressure sensitive adhesive by the application thereto of ultraviolet light, but also the adhesive force of the adhesive itself has been found to gradually decrease with time.

Therefore, when a resin film which contains a plasticizer is used as the base film of the pressure sensitive adhesive film, it is desired in the invention that a barrier layer to the bidirectional migration is interposed between the base film and the layer of the pressure sensitive adhesive. The barrier layer is composed of a resin, either in the form of a film or a coating, which is impermeable both to the plasticizer and the photopolymerizable acrylic acid ester but permeable to ultraviolet light, so that the barrier layer prevents the migration of the plasticizer in the base film into the layer of the adhesive but also the migration of the photopolymerizable acrylic acid ester in the adhesive into the base film. Thus, the barrier layer retains the photopolymerizable acrylic acid ester in the layer of the adhesive as well as retains the plasticizer in the base film, thereby in particular, to retain the function of the film reducible in the adhesive force by the application thereto of ultraviolet light after a long standing as well as to prevent the reduction in the adhesive force of the adhesive with time before the application thereto of ultraviolet light.

As the barrier layer mentioned above, a film or a coating of a resin such as polyolefin, e.g., polyethylene or polypropylene, polyalkylene terephthalate, e.g., polyethylene terephthalate, or polymethyl methacrylate, is preferred. The barrier layer is formed, for example, by laminating a film of the resin as specified above on the base film, or by coating a melt or a solution of the barrier resin on the film. Many of the alkyd modified acrylic resins and thermosetting acrylic resins including an acid, a hydroxyl, an epoxy or an amide type thermosetting acrylic resin are also suitable for the barrier coating. However, depending upon the photopolymerizable acrylic acid ester and the plasticizer used, some of the acrylic resins are often found to be soluble therein or swellable therewith, and therefore, when an acrylic resin is used as a barrier resin, it is necessary to choose such an acrylic resin which is neithersoluble in nor swellable with the photopolymerizable acrylic acid ester and the plasticizer used.

However, it will be understood that the barrier layer is not limited to those exemplified above, since any layer of a resin may function as the barrier layer if it is impermeable both to the plasticizer and the photopolymerizable acrylic acid ester, but permeable to the ultraviolet light.

Further according to the invention, the pressure sensitive adhesive preferably includes either an anhydrous silica powder or a polyisocyanate or a mixture of these, which causes the reduction to a greater extent in the adhesive force of the adhesive by the application thereto of ultraviolet light than the adhesive which contained neither the silica nor the polyisocyanate, but is otherwise the same as above.

The silica powder is incorporated into the adhesive in amounts of about 1-30 parts by weight in relation to 100 parts by weight of the elastic polymer. The use of the silica powder in amounts of less than about 1 part by weight in relation to 100 parts by weight of the elastic polymer is insufficient to cause a further extended reduction in the adhesive force by the application thereto of the ultraviolet light, compared with the same adhesive except that it contains no silica powder. However, the use of the silica powder in amounts of more than about 30 parts by weight makes the resultant liquid composition for forming a solid layer of the pressure sensitive adhesive layer excessively viscous to a gel-like substance, and as a result, for instance, the application of the liquid composition onto the base film difficult. The preferred amount of the silica is about 3-15 parts by weight in relation to 100 parts by weight of the elastic polymer. The silica powder used in the invention is preferably a finely divided powder, and for example, "Aerosil" by Degussa, West Germany, is suitable for use.

A polyisocyanate is also usable for causing a further extended reduction in the adhesive force of the pressure sensitive adhesive by the application thereto of ultraviolet light when the polyisocyanate is included in the adhesive in amounts of about 1-100 parts by weight in relation to 100 parts by weight of the elastic polymer in the adhesive. When the amount of the polyisocyanate used is less than about 1 part by weight in relation to 100 parts by weight of the elastic polymer, the resultant adhesive is not substantially reduced to an increased extent, whereas when the amount of the polyisocyanate is more than about 100 parts by weight, the resultant adhesive is gradually reduced in the adhesive force with time without the application thereto of the ultraviolet light. The preferred amount of polyisocyanate is about 3-40 parts by weight in relation to 100 parts by weight of the elastic polymer in the adhesive.

The polyisocyanate usable in the invention is not specifically limited, but a diisocyanate and a triisocyanate are preferably used. The diisocyanate usable includes, for instance, 2,4-tolylene diisocyanate, m-phenylene diisocyanate, m-xylylene diisocyanate, 4,4'-diphenyl diisocyanate, 4,4'-diphenylmethane diisocyanate, 1,5-naphthalene diisocyanate, isophorone diisocyanate, dianisidine diisocyanate and hexamethylene diisocyanate, and the triisocyanate usable includes, for instance, trimethylolpropane-tolylene diisocyanate adduct.

A urethane prepolymer prepared by the reaction of a diisocyanate in an excess amount with a dihydroxy alcohol so as to have isocyanate groups at the terminals of the polymer is also usable as a polyisocyanate in the invention.

The combined incorporation of the silica and the polyisocyanate results in a synergistic reduction in the adhesive force of the adhesive by the application thereto of ultraviolet light. As stated hereinbefore, the combined use of the silica and the polyisocyanate in amounts of about 1-30 parts by weight and about 1-100 parts by weight, respectively, in relation to 100 parts by weight of the elastic polymer in the adhesive is allowed in the invention. However, smaller amounts of both are sufficient to bring about the substantial reduction in the adhesive force to an increased extent due to the synergy of the combined use of the two additives. When the two are used in combination, the silica and the polyisocyanate are incorporated usually in amounts of about 1-20 parts by weight, preferably about 1-15 parts by weight, and 1-50 parts by weight, preferably about 1-20 parts by weight, respectively, in relation to 100 parts by weight of the elastic polymer in the adhesive.

The pressure sensitive adhesive and the adhesive film having a layer of such a pressure sensitive adhesive on one side of the base film as fully set forth as above according to the invention is especially suitable for use where it is needed that the adhesive has initially a relatively large adhesive force and thereafter is substantially reduced in the adhesive force.

Therefore, the pressure sensitive adhesive film is suitably usable as a dicing film in dicing a semiconductor wafer, as is stated hereinbefore. That is, the pressure sensitive adhesive film of the invention has initially a relatively large adhesive force, e.g., several hundred grams/25 mm, sufficient to fix the wafer thereon so that the wafer may be diced to dices of a precise size predetermined. Then when the film is irradiated by ultraviolet light from the other side thereof after the dicing of the wafer, the substantial reduction in the adhesive force of the film takes place, that is, the adhesive force is reduced to several grams/25 mm to several tens grams/25 mm, and as a result, the dice on the film is readily picked up therefrom.

A means and a method for applying ultraviolet light to the pressure sensitive adhesive or the film of the invention is not specifically limited, but any means and method may be used which are known in the field of photopolymerization technology. As an exemplification only, a xenon lamp, a low pressure, a medium pressure or a high pressure mercury lamp is used as a source of ultraviolet light, and ultraviolet light is applied to the film for a few seconds to a few minutes from the exposed back side of the film when the reduction in the adhesive force is needed, thereby to bring about the substantial reduction in the adhesive force of the film.

The pressure sensitive adhesive of the invention may include therein no photopolymerization initiator. As will be apparent, when the adhesive includes no initiator, an electron beam rather than ultraviolet light may be applied thereto so that the polymerization of the beforesaid photopolymerizable acrylic acid ester takes place in the absence of the initiator, thereby to reduce substantially adhesive force of the adhesive. When the film having on one side such an adhesive is used as a dicing film, the film is irradiated by the electron beam from the back of the film after the dicing of a semiconductor wafer so that the pressure sensitive adhesive is substantially reduced in the adhesive force. Then the dice is readily removed from the dicing film.

The invention will be more fully understood with reference to the following examples: however these examples are intended to illustrate the invention only, and are not to be construed as limits to the scope of the invention.

EXAMPLE 1

A liquid acrylic resin composition on the market which mainly includes polyacrylic acid esters as the elastic polymer and a tackifier was mixed with a photopolymerizable acrylic acid ester and a photopolymerization initiator to provide a liquid composition having the formation as shown in Table 1.

The thus prepared liquid composition was coated on a mold-releasing paper and dried at 120° C. for one minute to form a layer of pressure sensitive adhesive in solid of 10 μm in thickness.

A base film of 0.1 mm in thickness and composed of 100 parts by weight of polyvinyl chloride of an average polymerization degree of about 1300, 35 parts by weight of dioctyl phthalate and a small amount of an stabilizer was placed on and adhered to the layer of the adhesive, and then the mold-releasing paper was removed, to provide a pressure sensitive adhesive film of the invention which had on one side thereof a pressure sensitive adhesive including the photopolymerizable acrylic acid ester and the photopolymerization initiator.

The adhesive force of the pressure sensitive adhesive film was measured in a manner as follows. The film was cut to a test piece of 25 mm in widths and 100 mm in length, and the test piece was placed on a stainless steel plate. The test piece was then pressed against the stainless steel plate by having a 3 kg roll go and return on the adhesive film five times, and the 180° adhesive force was measured at a pulling rate of 300 mm/min. with a Schopper's tester.

The adhesive force of the film before the application thereto of ultraviolet light is presented in Table 1. Then ultraviolet light (365 mμ, 120 W/cm) is applied to the film from the other side thereof for 7 seconds, and the adhesive force was measured, which is presented in Table 1.

The pressure sensitive adhesive film according to the invention was found to be substantially reduced in adhesive force by the application thereto of ultraviolet light.

As a reference, a pressure sensitive adhesive film was prepared which contained no photopolymerizable acrylic acid ester, but was otherwise the same as above. The film was found to be reduced only slightly in the adhesive force by the application thereto of ultraviolet light, as presented in Reference Examples 1 and 2 in Table 1.

For a further reference, a pressure sensitive adhesive film was prepared in the same manner as above except the use of a liquid composition on the market including rubbers as the elastic polymer in place of polyacrylic acid ester coplymers. This film, including the photopolymerizable acrylic acid ester and the initiator, was found to increase in adhesive force by the application thereto of the ultraviolet light, as presented in Reference Examples 4 and 5.

TABLE 1

| | References | | Examples | | | | | | | | | | References | | |
|---|---|---|---|---|---|---|---|---|---|---|---|---|---|---|---|
| | 1 | 2 | 1 | 2 | 3 | 4 | 5 | 6 | 7 | 8 | 9 | 10 | 3 | 4 | 5 |
| Formation of Adhesive[1] | | | | | | | | | | | | | | | |
| Polythick 1001S[2] | 100 | | 100 | 100 | 100 | 100 | 100 | 100 | | 100 | 100 | 100 | 100 | | |
| Polythick 401SA[3] | | 100 | | | | | | | 100 | | | | | | |
| TRP-1[4] | | | | | | | | | | | | | | 100 | 100 |
| TMPTA[5] | | | 3 | 6 | 9 | 9 | 12 | | 12 | | 20 | 40 | 70 | 12 | |
| DPEHA[6] | | | | | | | | 9 | | 12 | | | | | 10 |
| Benzoin | | | 1 | | 0.5 | 1 | 1 | 1 | 1 | 1 | | | | 1 | 1 |
| Benzoin isopropylether | | | | 0.5 | | | | | | | 1 | 2 | 2 | | |
| Adsesive Force (g/25 mm) | | | | | | | | | | | | | | | |
| Before UV Irradiation | 750 | 950 | 500 | 480 | 450 | 450 | 500 | 400 | 550 | 350 | 380 | 250 | —[7] | 100 | 50 |
| After UV Irradiation | 700 | 900 | 300 | 205 | 60 | 20 | 1 | 2 | 6 | 0 | 5 | 2 | 0 | 120 | 60 |

Notes:
[1] Parts by weight
[2] Liquid acrylic adhesive (Sanyo Kasei Kogyo K.K.)
[3] Liquid acrylic adhesive (Sanyo Kasei Kogo K.K.)
[4] Liquid rubber adhesive (Saiden Kagaku K.K.)
[5] Trimethylolpropane triacrylate
[6] Dipentaerythritol hexaacrylate
[7] The adhesive was found to migrate onto the stainless steel plate.

The pressure sensitive adhesive film of Reference Example 3 contained the photopolymerizable acrylic acid ester in an excess amount, so that the adhesive was found to remain on the stainless steel plate after irradiation with ultraviolet light.

EXAMPLE 2

A mixture of a saturated copolyester, a tackifier, a photopolymerizable acrylic acid ester and an initiator was prepared in a mixed solvent composed of 80% by weight of toluene and 20% by weight of methyl ethyl ketone (the same in the following when a solvent is referred to), each in amounts specified in Table 2, to provide a liquid composition for a pressure sensitive adhesive.

The saturated copolyester used was a condensation product of a saturated dibasic carboxylic acid component consisting of terephthalic acid and sebacic acid in a molar ratio of the former to the latter of 70/30 and ethylene glycol component, in an equimolar ratio, and had a glass transition temperature of about 10° C.

The liquid composition was coated on a mold-releasing paper, and was then dried at 120° C. for one minute to form a layer of a pressure sensitive adhesive in solid of 10 μm in thickness. The same polyvinyl chloride film as used in Example 1 was placed on the layer of the adhesive on the base film, and then the mold-releasing paper was separated therefrom to provide a pressure sensitive adhesive film according to the invention.

As the adhesive force of the film before and after the appication thereto of ultraviolet light is presented in Table 2, the substantial reduction in the adhesive force took place by the application of ultraviolet light.

EXAMPLE 3

By the use of the same saturated copolyester as used in Example 2, a liquid composition was prepared which had the formation shown in Table 3. This liquid composition was coated on a mold-releasing paper, and then dried at 120° C. for one minute to form a layer of a pressure sesitive adhesive in solid of 10 μm in thickness.

A synthetic resin film of 0.1 mm in thickness as a base film other than polyvinyl chloride film was placed on the layer of the adhesive, and then the mold-releasing paper was separated therefrom to provide a pressure sesitive adhesive film according to the invention.

As the adhesive force of the film before and after the appication thereto of ultraviolet light is presented in Table 3, the substantial reduction in the adhesive force was found to take place by the application of ultraviolet light.

TABLE 3

|  | Examples | | | |
| --- | --- | --- | --- | --- |
|  | 1 | 2 | 3 | 4 |
| Formation of Adhesive[1] | | | | |
| Saturated copolyester | 30 | 30 | 30 | 30 |
| Xylene resin | 30 | 20 | 30 | 20 |
| Solvent | 70 | 70 | 70 | 70 |
| TMPTA[2] |  | 30 |  |  |
| DPEHA[3] | 30 |  | 30 | 30 |
| Benzoin isopropylether | 4 | 4 | 6 | 6 |

TABLE 2

|  | Examples | | | | | | | | | | | | | References | | |
| --- | --- | --- | --- | --- | --- | --- | --- | --- | --- | --- | --- | --- | --- | --- | --- | --- |
|  | 1 | 2 | 3 | 4 | 5 | 6 | 7 | 8 | 9 | 10 | 11 | 12 | 13 | 1 | 2 | 3 |
| Formation of Adhesive[1] | | | | | | | | | | | | | | | | |
| Saturated copolyester | 30 | 30 | 30 | 30 | 30 | 30 | 30 | 30 | 30 | 30 | 30 | 30 | 30 | 30 | 30 | 30 |
| Xylene resin | 30 | 40 | 40 | 40 | 60 | 20 | 25 | 20 | 10 | 5 | 5 | 5 | 5 | 20 | 40 | 5 |
| Other tackifiers[2] |  |  |  |  |  |  |  |  | 10 | 15 | 15 | 15 | 15 |  |  | 15 |
| Solvent | 70 | 70 | 70 | 70 | 70 | 70 | 70 | 70 | 70 | 70 | 70 | 70 | 70 | 70 | 70 | 70 |
| TMPTA[3] |  |  | 10 |  |  |  |  |  |  |  |  |  |  |  |  |  |
| DPEHA[4] |  |  |  |  | 20 |  | 25 | 30 |  | 30 | 20 |  | 20 |  |  |  |
| TMPTMA[5] | 10 | 10 |  | 20 |  | 12 |  |  | 30 |  |  | 20 |  |  |  |  |
| Benzoin |  |  | 2 |  |  | 2 |  |  |  |  |  |  |  |  |  |  |
| Benzoin isopropylether | 2 | 2 |  | 2 | 4 |  | 4 | 6 | 6 | 6 | 4 | 4 | 4 |  |  |  |
| Adsesive Force (g/25 mm) | | | | | | | | | | | | | | | | |
| Before UV Irradiation | 525 | 450 | 610 | 600 | 750 | 670 | 630 | 515 | 550 | 650 | 350 | 300 | 290 | 450 | 750 | 800 |
| After UV Irradiation | 90 | 100 | 85 | 100 | 94 | 86 | 60 | 35 | 45 | 50 | 95 | 80 | 88 | 400 | 700 | 700 |

Notes:
[1]Parts by weight
[2]Synthetic hydrocarbon oil in Example 9, terpene-phenol resin in Example 10, aliphatic petroleum resin in Example 11, styrene resin in Example 12, aliphatic petroleum resin in Example 13, and terpene-phenol resin in Reference 3.
[3]Trimethylolpropane triacrylate
[4]Dipentaerythritol hexaacrylate
[5]Trimethylolpropane trimethacrylate As a reference, a pressure sensitive adhesive film was prepared in the same manner as above which contained no photopolymerizable acrylic acid ester, but was otherwise the same as above. The film was found to be reduced only slightly in adhesive force by the application thereto of ultraviolet light, as illustrated in Reference Examples 1 to 3 in Table 2.

| Base Film[4] | PET | PP | PA | PMMA |
| --- | --- | --- | --- | --- |
| Adsesive Force (g/25 mm) | | | | |
| Before UV Irradiation | 450 | 400 | 300 | 250 |
| After UV Irradiation | 45 | 40 | 33 | 48 |

Notes:
[1]Parts by weight
[2]Trimethylolpropane triacrylate
[3]Dipentaerythritol hexaacrylate
[4]PET: Polyethylene terephthalate
PP: Polypropylene
PA: Polyamide
PPMA: Polymethyl methacrylate

TABLE 4

|  | Examples | | | | References | |
| --- | --- | --- | --- | --- | --- | --- |
|  | 1 | 2 | 3 | 4 | 1 | 2 |
| Formation of Adhesive[1] | | | | | | |
| Saturated copolyester | 30 | 30 | 30 | 30 | 30 | 30 |
| Xylene resin | 20 | 20 | 15 | 15 | 20 | 20 |
| Solvent | 70 | 70 | 70 | 70 | 70 | 70 |
| TMPTA[2] |  |  | 30 | 30 |  |  |

TABLE 4-continued

|  | Examples | | | | References | |
|---|---|---|---|---|---|---|
|  | 1 | 2 | 3 | 4 | 1 | 2 |
| DPEHA[3] | 30 | 20 |  |  | 30 |  |
| Benzoin isopropylether | 6 | 6 | 6 | 6 | 6 |  |
| Barrier Layer[4] | Ac | Ac | PP | PE | None | None |
| Adsesive Force (g/25 mm) | | | | | | |
| Initial | | | | | | |
| Before UV Irradiation | 510 | 470 | 350 | 300 | 560 | 450 |
| After UV Irradiation | 62 | 40 | 56 | 45 | 35 | 400 |
| After standing at 80° C. for 1 day | | | | | | |
| Before UV Irradiation | 530 | 435 | 300 | 280 | 20 | |
| After UV Irradiation | 50 | 42 | 50 | 55 | 100 | |
| After standing at 80° C. for 3 days | | | | | | |
| Before UV Irradiation | 450 | 450 | 310 | 285 | 0 | |
| After UV Irradiation | 52 | 45 | 40 | 38 | 25 | |
| After standing at 80° C. for 5 days | | | | | | |
| Before UV Irradiation | 480 | 425 | 290 | 275 | | |
| After UV Irradiation | 38 | 50 | 45 | 40 | | |
| After standing at normal temperature for 1 month | | | | | | |
| Before UV Irradiation | 500 | 400 | 300 | 280 | 325 | |
| After UV Irradiation | 55 | 45 | 48 | 56 | 25 | |
| After standing at normal temperature for 3 months | | | | | | |
| Before UV Irradiation | 450 | 420 | 310 | 250 | 0 | |
| After UV Irradiation | 45 | 50 | 42 | 32 | 15 | |

Notes:
[1]Parts by weight
[2]Trimethylolpropane triacrylate
[3]Dipentaerythritol hexaacrylate
[4]Ac: Coating of modified acrylic resin
PP: Polypropylene film
PE: Polyethylene film

EXAMPLE 4

A mixture of the same saturated copolyester as used in Example 2, a tackifier, a photopolymerizable acrylic acid ester, an initiator and the same solvent as used in Example 2, each in amounts specified in Table 4, was prepared to provide a liquid composition for forming on the base film a layer of the pressure sensitive adhesive. The formation of the liquid composition is presented in Table 4. The liquid composition was coated on a mold-releasing paper, and was then dried at 120° C. for one minute to form a layer of a pressure sensitive adhesive in solid of 10 μm in thickness.

A polyvinyl chloride film of 0.1 mm in thickness was prepared by a calendering process by the use of a composition composed of 100 parts by weight of polyvinyl chloride of an average polymerization degree of about 1300, 35 parts by weight of a plasticizer, either dioctyl phthalate or a polyester plasticizer, and a small amount of a stabilizer.

A barrier layer was then formed which was composed of a resin as shown in Table 4 on the polyvinyl chloride film. The polyvinyl chloride film was placed on the layer of the adhesive so that the barrier layer was in contact with the adhesive, to provide a pressure sensitive adhesive film of the invention having the barrier layer interposed between the base film and the layer of the adhesive.

After standing at a predetermined temperature for a predetermined period of time, the mold-releasing paper was removed, and the adhesive force of the film was measured. Then the film was irradiated by ultraviolet light from the back side thereof in the same manner as in Example 1, and the adhesive force was measured. The change in the adhesive force before and after the irradiation of ultraviolet light is presented in Table 4.

The pressure sensitive adhesive film of the invention was found to be substantially reduced in the adhesive force by the application thereto of ultraviolet light even after a long standing.

As a reference, a pressure sensitive adhesive film was prepared which contained no barrier layer, but was otherwise the same as above. As presented in Reference Example 1 in Table 4, the film of reference, immediately after the preparation, was found to be substantially reduced in the adhesive force by the application thereto of ultraviolet light, but after a long standing the film was found to have a tendency of being reduced irregularly in adhesive force with time without the application thereto of ultraviolet light.

Further, the film of reference was often found to increase in adhesive force by the application thereto of ultraviolet light after a long standing, contrary to the film of the invention.

As a further reference, a pressure sensitive adhesive film was prepared which contained no photopolymerizable acrylic acid ester, but was otherwise the same as above. This film was found to be substantially unchanged in adhesive force by the application thereto of ultraviolet light even immediately after the preparation.

EXAMPLE 5

A liquid acrylic resin composition on the market (Polythick 610SA, Sanyo Kasei Kogyo K.K.) including polyacrylic acid ester copolymers in amounts of about 40% by weight based on the composition as the elastic polymer was mixed with a photopolymerizable acrylic acid ester and an initiator, each in amounts specified in Table 5, and then the resulting liquid composition was coated on a mold-releasing paper, dried at 120° C. for one minute to form a layer of a pressure sensitive adhesive in solid of 10 μm in thickness.

In the same manner as in Example 4, a barrier layer was formed on the same polyvinyl chloride film as used in Example 4, and a pressure sensitive adhesive film having the barrier layer between the base film and the layer of the adhesive was prepared.

The pressure sensitive adhesive film of the invention was found to be substantially reduced in adhesive force by the application thereto of ultraviolet light even after a long standing, as illustrated in Table 5.

TABLE 5

|  | Examples | | | Reference |
|---|---|---|---|---|
|  | 1 | 2 | 3 | 1 |
| Formation of Adhesive[1] | | | | |
| Liquid acrylic adhesive | 100 | 100 | 100 | 100 |
| TMPTA[2] | 30 | 20 | | |
| DPEHA[3] | | | 30 | |
| Benzoin isopropylether | 6 | 6 | 6 | |
| Barrier Layer[4] | Ac | Ac | Ac | Ac |
| Adsesive Force (g/25 mm) Initial | | | | |
| Before UV Irradiation | 690 | 700 | 720 | 710 |
| After UV Irradiation | 58 | 68 | 50 | 690 |
| After standing at 80° C. for 1 day | | | | |
| Before UV Irradiation | 650 | 700 | 710 | |
| After UV Irradiation | 54 | 60 | 50 | |
| After standing at 80° C. for 3 days | | | | |
| Before UV Irradiation | 700 | 720 | 600 | |
| After UV Irradiation | 56 | 62 | 48 | |
| After standing at 80° C. for 5 days | | | | |
| Before UV Irradiation | 650 | 690 | 650 | |
| After UV Irradiation | 60 | 68 | 52 | |
| After standing at normal temperature for 1 month | | | | |
| Before UV Irradiation | 660 | 650 | 620 | |
| After UV Irradiation | 60 | 70 | 65 | |
| After standing at normal temperature for 3 months | | | | |
| Before UV Irradiation | 620 | 680 | 600 | |
| After UV Irradiation | 54 | 58 | 60 | |

Notes:
[1]Parts by weight
[2]Trimethylolpropane triacrylate
[3]Dipentaerythritol hexaacrylate
[4]Ac: Coating of modified acrylic resin As a reference, a pressure sensitive adhesive film was prepared which contained no photopolymerizable acrylic acid ester, but was otherwise the same as above. The film was found to be substantially unchanged in adhesive force by the application thereto of ultraviolet light even immediately after the preparation, as illustrated in Reference Example 1 in Table 5.

EXAMPLE 6

A mixture of the same saturated copolyester as used in Example 2, a tackifier, a photopolymerizable acrylic acid ester, an initiator, the same solvent as used in Example 2 and anhydrous silica powder ("Aerosil" (Trademark), Degussa, West Germany, the same in the following), each in amounts specified in Table 6, was prepared to provide a liquid composition having the formation as shown in Table 6. The liquid composition was coated on a mold-releasing paper, and then was dried at 120° C. for one minute to form a layer of a pressure sensitive adhesive in solid of 10 μm in thickness.

A barrier layer was formed on the same polyvinyl chloride film as used in Example 4 by coating a solution of modified acrylic resin on the market followed by drying, and the polyvinyl chloride film was then placed on the layer of the adhesive so that the barrier layer was in contact with the adhesive, to provide a pressure sensitive adhesive film of the invention having the barrier layer interposed between the base film and the layer of the adhesive.

After standing at a predetermined temperature for a predetermined period of time, the mold-releasing paper was removed, and the adhesive force of the film was measured. Then the film was irradiated by ultraviolet light from the back side thereof in the same manner as in Example 1, followed by the measurement of adhesive force. The change in the adhesive force is presented in Table 6.

As a reference, a pressure sensitive adhesive film was prepared which contained no silica powder but was otherwise the same as above.

First the film containing the silica powder was found to be substantially reduced in adhesive force by the application thereto of ultraviolet light even after a long standing. Second the film containing the silica powder was found to be reduced in adhesive force to a greater extent than the film containing no silica powder therein, but was otherwise the same, as apparent from the comparison with Reference Examples 1 and 2 in Table 6.

However, it is to be noted that the pressure sensitive adhesive films of Reference Examples 1 and 2 are still within the scope of the invention.

TABLE 6

|  | Examples | | | | | References | |
|---|---|---|---|---|---|---|---|
|  | 1 | 2 | 3 | 4 | 5 | 1 | 2 |
| Formation of Adhesive[1] | | | | | | | |
| Saturated copolyester | 30 | 30 | 30 | 30 | 30 | 30 | 30 |
| Xylene resin | 15 | 15 | 15 | 15 | 15 | 15 | 15 |
| Solvent | 70 | 70 | 70 | 70 | 70 | 70 | 70 |
| TMPTA[2] | 20 | 20 | 20 | 30 | | 20 | 30 |
| DPEHA[3] | | | | | 30 | | |
| Benzoin | 6 | 6 | 6 | 6 | | | |
| Benzoin isopropylether | | | | | 6 | 6 | 6 |
| Silica[4] | 1 | 3 | 5 | 3 | 3 | 0 | 0 |
| Adhesive Force (g/25 mm) Initial | | | | | | | |
| Before UV Irradiation | 530 | 480 | 610 | 300 | 525 | 470 | 520 |
| After UV Irradiation | 40 | 25 | 20 | 45 | 42 | 75 | 60 |
| After standing at 80° C. for 1 day | | | | | | | |
| Before UV Irradiation | 525 | 480 | 570 | 280 | 500 | 490 | 515 |
| After UV Irradiation | 38 | 30 | 18 | 55 | 34 | 80 | 58 |
| After standing at 80° C. for 3 days | | | | | | | |
| Before UV Irradiation | 535 | 510 | 550 | 285 | 495 | 500 | 500 |
| After UV Irradiation | 35 | 30 | 25 | 38 | 30 | 78 | 70 |
| After standing at 80° C. for 5 days | | | | | | | |

TABLE 6-continued

|  | Examples | | | | | References | |
|---|---|---|---|---|---|---|---|
|  | 1 | 2 | 3 | 4 | 5 | 1 | 2 |
| Before UV Irradiation | 540 | 450 | 545 | 275 | 500 | 485 | 524 |
| After UV Irradiation | 35 | 28 | 20 | 40 | 32 | 68 | 66 |
| After standing at normal temperture for 1 month | | | | | | | |
| Before UV Irradiation | 540 | 500 | 580 | 280 | 520 | 500 | 510 |
| After UV Irradiation | 35 | 35 | 30 | 56 | 38 | 70 | 60 |
| After standing at normal temperature for 3 months | | | | | | | |
| Before UV Irradiation | 500 | 470 | 550 | 250 | 525 | 492 | 498 |
| After UV Irradiation | 33 | 20 | 25 | 32 | 35 | 68 | 72 |

Notes:
[1] Parts by weight
[2] Trimethylolpropane triacrylate
[3] Dipentaerythritol hexaacrylate
[4] δAerosil," Degussa, West Germany

TABLE 7

|  | Examples | |
|---|---|---|
|  | 1 | 2 |
| Formation of Adhesive[1] | | |
| Liquid acrylic adhesive | 100 | 100 |
| DPEHA[2] | 30 | 30 |
| Benzoin isopropylether | 6 | 6 |
| Silica[3] | 5 | 10 |
| Adhesive Force (g/25 mm) Initial | | |
| Before UV Irradiation | 700 | 800 |
| After UV Irradiation | 30 | 28 |
| After standing at 80° C. for 1 day | | |
| Before UV Irradiation | 720 | 780 |
| After UV Irradiation | 25 | 25 |
| After standing at 80° C. for 3 days | | |
| Before UV Irradiation | 700 | 750 |
| After UV Irradiation | 28 | 25 |
| After standing at 80° C. for 5 days | | |
| Before UV Irradiation | 690 | 700 |
| After UV Irradiation | 30 | 20 |
| After standing at normal temperature for 1 month | | |
| Before UV Irradiation | 685 | 725 |
| After UV Irradiation | 30 | 25 |
| After standing at normal temperature for 3 months | | |
| Before UV Irradiation | 654 | 700 |
| After UV Irradiation | 26 | 24 |

Notes:
[1] Parts by weight
[2] Dipentaerythritol hexaacrylate
[3] "Aerosil," Degussa, West Germany

EXAMPLE 7

The same liquid acrylic resin composition as used in Example 5 was mixed with a photopolymerizable acrylic acid ester, an initiator and the same anhydrous silica powder used in Example 6, each in amounts specified in Table 7, to provide a liquid composition having the formation as shown in Table 7. The liquid composition was coated on a mold-releasing paper, and then was dried at 120° C. for one minute to form a layer of a pressure sensitive adhesive in solid of 10 μm in thickness.

A barrier layer was then formed in the same manner as in Example 6 on the same polyvinyl chloride film as used in Example 4, and the polyvinyl chloride film was then placed on the layer of the adhesive, to provide a pressure sensitive adhesive of the invention having the barrier layer between the base film and the layer of the adhesive.

The film containing the silica powder was found to be substantially reduced in adhesive force by the application thereto of ultraviolet light even after a long standing.

EXAMPLE 8

In the same manner as in Example 6 except the use of a polyisocyanate in place of the silica powder, a pressure sensitive adhesive film having the same barrier coating of modified acrylic resin as the beforementioned was prepared. The formation of the liquid composition used for forming the layer of the pressure sensitive adhesive is shown in Table 8.

As a reference, a pressure sensitive adhesive film was prepared in the same manner as in Example 6 except that the film contained no polyisocyanate.

TABLE 8

|  | Examples | | | | | References | |
|---|---|---|---|---|---|---|---|
|  | 1 | 2 | 3 | 4 | 5 | 1 | 2 |
| Formation of Adhesive[1] | | | | | | | |
| Saturated copolyester | 30 | 30 | 30 | 30 | 30 | 30 | 30 |
| Xylene resin | 20 | 20 | 20 | 20 | 15 | 15 | 25 |
| Solvent | 70 | 70 | 70 | 70 | 70 | 70 | 70 |
| TMPTA[2] | | | | | 20 | | 20 |
| DPEHA[3] | 30 | 30 | 30 | 30 | | 30 | |
| Benzoin | 6 | | | | | | |
| Benzoin isopropylether | | 6 | 6 | 6 | 4 | 6 | 4 |
| Polyisocyanate[4] | 2 | 5 | 10 | 20 | 5 | 0 | 0 |
| Adsesive Force (g/25 mm) Initial | | | | | | | |
| Before UV Irradiation | 500 | 495 | 350 | 350 | 550 | 525 | 525 |
| After UV Irradiation | 35 | 32 | 25 | 18 | 30 | 60 | 85 |
| After standing at 80° C. for 1 day | | | | | | | |
| Before UV Irradiation | 480 | 510 | 300 | 250 | 500 | 515 | 530 |

TABLE 8-continued

|  | Examples | | | | | References | |
| --- | --- | --- | --- | --- | --- | --- | --- |
|  | 1 | 2 | 3 | 4 | 5 | 1 | 2 |
| After UV Irradiation | 40 | 30 | 28 | 15 | 45 | 55 | 78 |
| After standing at 80° C. for 3 days | | | | | | | |
| Before UV Irradiation | 520 | 500 | 325 | 200 | 480 | 500 | 550 |
| After UV Irradiation | 32 | 28 | 25 | 20 | 40 | 60 | 80 |
| After standing at 80° C. for 5 days | | | | | | | |
| Before UV Irradiation | 490 | 515 | 350 | 200 | 490 | 505 | 525 |
| After UV Irradiation | 20 | 26 | 24 | 12 | 35 | 62 | 75 |
| After standing at normal temperature for 1 month | | | | | | | |
| Before UV Irradiation | 490 | 500 | 392 | 300 | 510 | 525 | 530 |
| After UV Irradiation | 40 | 30 | 28 | 20 | 38 | 55 | 80 |
| After standing at normal temperature for 3 months | | | | | | | |
| Before UV Irradiation | 510 | 510 | 350 | 200 | 500 | 510 | 530 |
| After UV Irradiation | 38 | 32 | 30 | 16 | 36 | 58 | 70 |

Notes:
(1)Parts by weight
(2)Trimethylolpropane triacrylate
(3)Dipentaerythritol hexaacrylate
(4)Triisocyanate "Sumidule," Sumitomo Kagaku Kogyo K.K.

The film containing the polyisocyanate according to the invention was found to be substantially reduced in the adhesive force by the application thereto of ultraviolet light even after a long standing, but also was found to be reduced in adhesive force to a greater extent than the film containing no polyisocyanate therein, as illustrated in comparison with Reference Examples 1 and 2 in Table 8.

EXAMPLE 9

The same liquid acrylic resin composition as used in Exaple 5 was mixed with a photopolymerizable acrylic acid ester, an initiator and a polyisocyanate, each in amounts specified in Table 9, to provide a liquid composition having the formation as shown in Table 9.

By the use of the liquid composition thus prepared, a pressure sensitive adhesive film was prepared in the same manner as in Example 6 having the same barrier coating of modified acrylic resin as beforementioned between the base film and the pressure sensitive adhesive.

The film containing the polyisocyanate was found to be substantially reduced in adhesive force by the application thereto of the ultraviolet light even after a long standing, as illustrated in Table 9.

TABLE 9

|  | Examples | |
| --- | --- | --- |
|  | 1 | 2 |
| Formation of Adhesive(1) | | |
| Liquid acrylic adhesive | 100 | 100 |
| DPEHA(2) | 30 | 30 |
| Benzoin isopropylether | 6 | 6 |
| Polyisocyanate(3) | 5 | 10 |
| Adsesive Force (g/25 mm) | | |
| Initial | | |
| Before UV Irradiation | 620 | 670 |
| After UV Irradiation | 35 | 25 |
| After standing at 80° C. for 1 day | | |
| Before UV Irradiation | 570 | 580 |
| After UV Irradiation | 28 | 14 |
| After standing at 80° C. for 3 days | | |
| Before UV Irradiation | 590 | 610 |
| After UV Irradiation | 30 | 20 |
| After standing at 80° C. for 5 days | | |

TABLE 9-continued

|  | Examples | |
| --- | --- | --- |
|  | 1 | 2 |
| Before UV Irradiation | 600 | 595 |
| After UV Irradiation | 30 | 18 |
| After standing at normal temperature for 1 month | | |
| Before UV Irradiation | 600 | 650 |
| After UV Irradiation | 30 | 20 |
| After standing at normal temperature for 3 months | | |
| Before UV Irradiation | 570 | 580 |
| After UV Irradiation | 28 | 22 |

Notes:
(1)Parts by weight
(2)Dipentaerythritol hexaacrylate
(3)Triisocyanate "Sumidule," Sumitomo Kagaku Kogyo K.K.

EXAMPLE 10

In the same manner as in Example 6 except the combined use of silica powder and the polyisocyanate, a pressure sensitive adhesive film having the same barrier coating of modified acrylic resin as beforementioned was prepared. The formation of the liquid composition used is shown in Table 10.

As a reference, a pressure sensitive adhesive film was prepared which contained only one of silica powder and the polyisocyanate.

The film containing both the polyisocyanate and the silica was found to be reduced in the adhesive force to a greater extent by the application thereto of ultraviolet light than the film containing only one of the polyisocyanate and the silica, as illustrated in comparison with Reference Examples 1 and 2 in Table 10.

However, the pressure sensitive adhesive films of Reference Examples 1 and 2 are still greater in the degree of reduction in the adhesive force by the application thereto of ultraviolet light than the films of Reference Examples 3 and 4 which contained neither the silica nor the polyisocyanate. It is also to be noted that these films of Reference Examples 1 to 4 are all substantially reducible in adhesive force by the ultraviolet irradiation and are within the scope of the present invention.

TABLE 10

| | Examples | | | | | References | | | |
|---|---|---|---|---|---|---|---|---|---|
| | 1 | 2 | 3 | 4 | 5 | 1 | 2 | 3 | 4 |
| Formation of Adhesive[1] | | | | | | | | | |
| Saturated copolyester | 30 | 30 | 30 | 30 | 30 | 30 | 30 | 30 | 30 |
| Xylene resin | 15 | 20 | 30 | 30 | 20 | 20 | 15 | 20 | 15 |
| Solvent | 70 | 70 | 70 | 70 | 70 | 70 | 70 | 70 | 70 |
| TMPTA[2] | | | 30 | | 20 | | | | |
| DPEHA[3] | 30 | 30 | | 30 | | 30 | 30 | 30 | 30 |
| Benzoin | 6 | | | | 4 | | | | |
| Benzoin isopropylether | | 4 | 6 | 6 | | 6 | 6 | 6 | 6 |
| Polyisocyanate[4] | 2 | 3 | 3 | 2 | 2 | 5 | 0 | 0 | 0 |
| Silica[5] | 2 | 5 | 5 | 5 | 2 | 0 | 3 | 0 | 0 |
| Adsesive Force (g/25 mm) Initial | | | | | | | | | |
| Before UV Irradiation | 492 | 550 | 480 | 510 | 610 | 495 | 525 | 510 | 350 |
| After UV Irradiation | 8 | 6 | 5 | 10 | 20 | 32 | 42 | 62 | 56 |
| After standing at 80° C. for 1 day | | | | | | | | | |
| Before UV Irradiation | 510 | 545 | 450 | 525 | 600 | 510 | 500 | 530 | 300 |
| After UV Irradiation | 10 | 14 | 4 | 8 | 18 | 30 | 34 | 50 | 50 |
| After standing at 80° C. for 3 days | | | | | | | | | |
| Before UV Irradiation | 460 | 500 | 465 | 514 | 570 | 500 | 495 | 450 | 310 |
| After UV Irradiation | 4 | 4 | 10 | 12 | 12 | 28 | 30 | 52 | 40 |
| After standing at 80° C. for 5 days | | | | | | | | | |
| Before UV Irradiation | 500 | 525 | 485 | 520 | 550 | 515 | 500 | 485 | 290 |
| After UV Irradiation | 2 | 2 | 8 | 10 | 14 | 26 | 32 | 38 | 45 |
| After standing at normal temperature for 1 month | | | | | | | | | |
| Before UV Irradiation | 472 | 550 | 480 | 500 | 540 | 500 | 520 | 500 | 300 |
| After UV Irradiation | 10 | 5 | 4 | 13 | 18 | 30 | 38 | 55 | 48 |
| After standing at normal temperature for 3 months | | | | | | | | | |
| Before UV Irradiation | 514 | 500 | 470 | 498 | 520 | 510 | 525 | 450 | 310 |
| After UV Irradiation | 17 | 14 | 6 | 10 | 13 | 32 | 35 | 45 | 42 |

Notes:
[1]Parts by weight
[2]Trimethylolpropane triacrylate
[3]Dipentaerythritol hexaacrylate
[4]Triisocyanate "Sumidule,"Sumitomo Kagaku Kogyo K.K.
[5]"Aerosil,"Degussa, West Germany

EXAMPLE 11

The same acrylic liquid composition for a pressure sensitive adhesive as used in Exaple 5 was mixed with a photopolymerizable acrylic acid ester, an initiator, the polyisocyanate and the silica powder, each in amounts specified in Table 11, to provide a liquid composition for the pressure sensitive adhesive. The formation of the liquid composition is shown in Table 11.

By the use of the liquid composition thus prepared, a pressure sensitive adhesive film was prepared in the same manner as in Example 6 having the same barrier coating of modified acrylic resin.

The film containing the polyisocyanate and the silica powder was found to be reduced in the adhesive force to a greater extent than the film containing only one of the polyisocyanate and the silica powder, as illustrated in comparison with Reference Examples 1 and 2 in Table 11.

The films of Examples 1 and 2 are, however, still greater in the degree of reduction in adhesive force when being irradiated by ultraviolet light than the film of Reference Example 3, and are in accordance with the invention. The film of Example 3 is also a pressure sensitive adhesive film of the invention.

TABLE 11

| | Examples | | | | | References | | |
|---|---|---|---|---|---|---|---|---|
| | 1 | 2 | 3 | 4 | 5 | 1 | 2 | 3 |
| Formation of Adhesive[1] | | | | | | | | |
| Liquid acrylic adhesive | 100 | 100 | 100 | 100 | 100 | 100 | 100 | 100 |
| DPEHA[2] | 20 | 30 | 30 | 30 | 20 | 30 | 30 | 30 |
| Benzoin isopropylether | 6 | 6 | 6 | 6 | 6 | 6 | 6 | 6 |
| Polyisocyanate[3] | 1 | 2 | 3 | 5 | 10 | 5 | 0 | 0 |
| Silica[4] | 2 | 2 | 5 | 3 | 2 | 0 | 3 | 0 |
| Adsesive Force (g/25 mm) Initial | | | | | | | | |
| Before UV Irradiation | 700 | 600 | 605 | 620 | 700 | 620 | 600 | 510 |
| After UV Irradiation | 20 | 8 | 6 | 6 | 12 | 35 | 50 | 70 |
| After standing at 80° C. for 1 day | | | | | | | | |
| Before UV Irradiation | 680 | 625 | 630 | 620 | 600 | 570 | 588 | 500 |
| After UV Irradiation | 18 | 10 | 4 | 6 | 2 | 28 | 42 | 68 |
| After standing at 80° C. for 3 days | | | | | | | | |
| Before UV Irradiation | 720 | 650 | 610 | 650 | 549 | 590 | 602 | 508 |
| After UV Irradiation | 12 | 4 | 4 | 4 | 12 | 30 | 38 | 75 |
| After standing at 80° C. for 5 days | | | | | | | | |

TABLE 11-continued

| | Examples | | | | | References | | |
|---|---|---|---|---|---|---|---|---|
| | 1 | 2 | 3 | 4 | 5 | 1 | 2 | 3 |
| Before UV Irradiation | 800 | 700 | 600 | 600 | 550 | 600 | 598 | 512 |
| After UV Irradiation | 18 | 4 | 12 | 12 | 4 | 30 | 40 | 78 |
| After standing at normal temperature for 1 month | | | | | | | | |
| Before UV Irradiation | 650 | 650 | 625 | 600 | 680 | 600 | 590 | 520 |
| After UV Irradiation | 22 | 15 | 5 | 12 | 4 | 30 | 42 | 80 |
| After standing at normal temperature for 3 months | | | | | | | | |
| Before UV Irradiation | 600 | 595 | 580 | 570 | 600 | 570 | 600 | 500 |
| After UV Irradiation | 20 | 6 | 4 | 4 | 2 | 28 | 44 | 82 |

Notes:
[1]Parts by weight
[2]Dipentaerythritol hexaacrylate
[3]Triisocyanate "Sumidule," Sumitomo Kagaku Kogyo K.K.
[4]"Aerosil," Degussa, West Germany

EXAMPLE 12

The same liquid acrylic acid ester copolymer composition as used in Example 5 and the same saturated copolyester as used in Example 2 were both incorporated into a liquid composition together with a solvent, a tackifier, dipentaerythritol hexaacrylate, benzoin isopropylether, silica and a polyisocyanate. The formation of the resultant liquid composition is presented in Table 12.

By the use of the liquid composition, a pressure sensitive adhesive film was prepared in the same manner as in Example 6 having the same barrier coating of modified acrylic resin as beforesaid between the polyvinyl chloride base film and the pressure sensitive adhesive.

The tackiness and adhesive migration were measured as follows.

Tackiness

A pressure sensitive adhesive film was fixed on a horizontal plane at 21° C. with the layer of adhesive exposed, and a stainless steel plate was supported on the plane so that the plate intersected at the lower end with the plane at an angle of 30°. A stainless steel ball of 8.0 mm in diameter and 2.0 g in weight was placed on the steel plate at a position 50 mm apart from the lower end of the plate, and then was allowed to roll down on the slope. The tackiness was estimated in terms of the distance between the lower end of the steel plate and the position at which the ball stopped.

TABLE 12

| | Examples | | | | References | |
|---|---|---|---|---|---|---|
| | 1 | 2 | 3 | 4 | 1 | 2 |
| Formation of Adhesive[1] | | | | | | |
| Polythick 610SA[2] | 20 | 40 | 60 | 80 | | |
| Saturated copolyester | 24 | 18 | 12 | 6 | 30 | 30 |
| Xylene resin | 15 | 15 | 15 | 15 | 15 | 15 |
| Solvent | 56 | 42 | 28 | 14 | 70 | 70 |
| DPEHA[3] | 30 | 30 | 30 | 30 | 30 | 30 |
| Benzoin isopropyl ether | 6 | 6 | 6 | 6 | 6 | 6 |
| Silica[4] | 4 | 4 | 4 | 6 | 2 | 4 |
| Polyisocyanate[5] | 7 | 7 | 7 | 9 | 5 | 7 |
| Adsesive Force (g/25 mm) Initial | | | | | | |
| Before UV Irradiation | 500 | 610 | 650 | 625 | 620 | 585 |
| After UV Irradiation | 18 | 17 | 14 | 20 | 12 | 10 |
| After standing at 80° C. for 7 days | | | | | | |
| Before UV Irradiation | 520 | 550 | 650 | 600 | 600 | 550 |
| After UV Irradiation | 15 | 13 | 12 | 18 | 13 | 12 |
| After standing at normal temperature for 3 months | | | | | | |
| Before UV Irradiation | 550 | 590 | 620 | 630 | 625 | 590 |
| After UV Irradiation | 12 | 15 | 18 | 20 | 10 | 10 |
| Tackiness at 21° C. (cm) | | | | | | |
| Initial (Before UV Irradiation) | 1.2 | 1.0 | 0.5 | 0.7 | 6.5 | 5.3 |
| Adhesive Migration (21° C.)[6] | | | | | | |
| After 1 day | 1 | 1 | 1 | 1 | 4 | 3 |
| After 4 days | 1 | 1 | 1 | 1 | 5 | 5 |
| After 7 days | 1 | 1 | 2 | 1 | 5 | 5 |

Notes:
[1]Parts by weight
[2]Liquid acrylic adhesive (Sanyo Kasei Kogyo K.K.)
[3]Dipentaerythritol hexaacrylate
[4]"Aerosil," Degussa, West Germany
[5]Triisocyanate "Sumidule," Sumitomo Kagaku K.K.
[6]Five grade estimation; the more the figure, the more the migration.

Adhesive Migration

A pressure sensitive adhesive film of 25 mm in width and 100 mm in length was adhered onto a stainless steel plate and was left standing at a predetermined period of time at 21° C. Thereafter the film was separated from the plate at a pulling rate of 300 mm/min. by a Schopper's tester, and the plate was examined whether the adhesive was migrated thereonto.

The above pressure sensitive adhesive film was found to have a pronouncedly large tackiness, but substantially no adhesive was found on the plate even after a long standing of seven days, as shown in Table 12.

As a reference example, an adhesive film was prepared which included only the saturated copolyester as an elastic polymer. The formation of the liquid composition used is presented in Table 12.

The reference adhesive film was found to have a smaller tackiness, and at the same time the adhesive was found to migrate onto the plate. However, it is to be noted that the adhesive films of Reference Examples 1 and 2 are in accordance with the invention.

What is claimed is:

1. A pressure sensitive adhesive reducible in adhesive force by the application thereto of ultraviolet light which comprises:
   (i) at least one elastic polymer selected from the group consisting of a polymer comprising an acrylic acid ester copolymer, and a saturated copolyester comprising a dibasic carboxylic acid and a dihydroxy alcohol;
   (ii) an ultraviolet light polymerizable acrylic acid ester having not less than two acryloyl or methacryloyl groups in the molecule and having a molecular weight of not more than about 1000, in amounts of about 15-200 parts by weight in relation to 100 parts by weight of the elastic polymer;
   (iii) a tackifier in amounts of about 10-200 parts by weight in relation to 100 parts by weight of the elastic polymer;
   (iv) anhydrous silica powder in amounts of about 1-30 parts by weight in relation to 100 parts by weight of the elastic polymer;
   (v) a polyisocyanate in amounts of about 1-100 parts by weight in relation to 100 parts by weight of the elastic polymer; and
   (vi) a photopolymerization initiator in a sufficient amount to induce the photopolymerization of the ultraviolet light polymerizable acrylic acid ester.

2. A pressure sensitive adhesive film reducible in adhesive force by the application thereto of ultraviolet light which comprises:
   (a) a base film permeable to the ultraviolet light; and
   (b) a layer of a pressure sensitive adhesive formed on one side of the base film, the adhesive comprising:
      (i) at least one elastic polymer selected from the group consisting of a polymer comprising an acrylic acid ester copolymer, and a saturated copolyester comprising a dibasic carboxylic acid and a dihydroxy alcohol;
      (ii) an ultraviolet light polymerizable acrylic acid ester having not less than two acryloyl or methacryloyl groups in the molecule and having a molecular weight of not more than about 1000, in amounts of about 15-200 parts by weight in relation to 100 parts by weight of the elastic polymer;
      (iii) a tackifier in amounts of about 10-200 parts by weight in relation to 100 parts by weight of the elastic polymer;
      (iv) anhydrous silica powder in amounts of about 1-30 parts by weight in relation to 100 parts by weight of the elastic polymer;
      (v) a polyisocyanate in amounts of about 1-100 parts by weight in relation to 100 parts by weight of the elastic polymer; and
      (vi) a photopolymerization initiator in a sufficient amount to induce the photopolymerization of the ultraviolet light polymerizable acrylic acid ester.

3. The pressure sensitive adhesive film as claimed in claim 2, wherein the base film is a polyvinyl chloride film.

4. A pressure sensitive adhesive film reducible in adhesive force by the application thereto of electromagnetic waves which comprises:
   (a) a base film permeable to the electromagnetic wave; and
   (b) a layer of a pressure sensitive adhesive formed on one side of the base film, the adhesive comprising:
      (i) at least one elastic polymer selected from the group consisting of a polymer comprising an acrylic acid ester copolymer, and a saturated copolyester comprising a dibasic carboxylic acid and a dihydroxy alcohol;
      (ii) an electromagnetic wave polymerizable acrylic acid ester having not less than two acryloyl or methacryloyl groups in the molecule and having a molecular weight of not more than about 1000, in amounts of about 15-200 parts by weight in relation to 100 parts by weight of the elastic polymer;
      (iii) a tackifier in amounts of about 10-200 parts by weight in relation to 100 parts by weight of the elastic polymer;
      (iv) anhydrous silica powder in amounts of about 1-30 parts by weight in relation to 100 parts by weight of the elastic polymer;
      (v) a polyisocyanate in amounts of about 1-100 parts by weight in relation to 100 parts by weight of the elastic polymer.

5. A pressure sensitive adhesive film reducible in adhesive force by the application thereto of electron beam which comprises:
   (a) a base film permeable to the electron beam; and
   (b) a layer of a pressure sensitive adhesive formed on one side of the base film, the adhesive comprising:
      (i) at least one elastic polymer selected from the group consisting of a polymer comprising an acrylic acid ester copolymer, and a saturated copolyester comprising a dibasic carboxylic acid and a dihydroxy alcohol;
      (ii) an electron beam polymerizable acrylic acid ester having not less than two acryloyl or methacryloyl groups in the molecule and having a molecular weight of not more than about 1000, in amounts of about 15-200 parts by weight in relation to 100 parts by weight of the elastic polymer;
      (iii) a tackifier in amounts of about 10-200 parts by weight in relation to 100 parts by weight of the elastic polymer;
      (iv) anhydrous silica powder in amounts of about 1-30 parts by weight in relation to 100 parts by weight of the elastic polymer;
      (v) a polyisocyanate in amounts of about 1-100 parts by weight in relation to 100 parts by weight of the elastic polymer.

* * * * *